United States Patent
Terasaki et al.

(10) Patent No.: US 10,370,303 B2
(45) Date of Patent: Aug. 6, 2019

(54) PROCESS FOR PRODUCING BONDED BODY AND PROCESS FOR PRODUCING POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 296 days.

(21) Appl. No.: 15/304,544

(22) PCT Filed: Apr. 16, 2015

(86) PCT No.: PCT/JP2015/061719
§ 371 (c)(1),
(2) Date: Oct. 17, 2016

(87) PCT Pub. No.: WO2015/163232
PCT Pub. Date: Oct. 29, 2015

(65) Prior Publication Data
US 2017/0044072 A1  Feb. 16, 2017

(30) Foreign Application Priority Data
Apr. 25, 2014 (JP) .................. 2014-091955

(51) Int. Cl.
*B23K 1/00* (2006.01)
*C04B 37/02* (2006.01)
(Continued)

(52) U.S. Cl.
CPC .............. *C04B 37/026* (2013.01); *B23K 1/00* (2013.01); *B23K 1/19* (2013.01); *B23K 1/20* (2013.01);
(Continued)

(58) Field of Classification Search
CPC ................ H05K 1/0306; B23K 1/0016; B23K 2101/38; B23K 2101/42; B23K 2103/10; B23K 2103/18
See application file for complete search history.

(56) References Cited

U.S. PATENT DOCUMENTS 5,403,651 A * 4/1995 Miyagi ............... H01L 21/4839
                                                            428/209
6,261,703 B1   7/2001 Sasaki et al.
2004/0262367 A1* 12/2004 Nakamura .......... H01L 23/3735
                                                            228/122.1

FOREIGN PATENT DOCUMENTS

CN  101972901 A   2/2011
CN  105027277 A  11/2015
(Continued)

OTHER PUBLICATIONS

Office Action dated Apr. 28, 2018, issued for the Chinese patent application No. 201580013381.X.
(Continued)

Primary Examiner — Erin B Saad
(74) Attorney, Agent, or Firm — Locke Lord LLP

(57) ABSTRACT

Disclosed is provided a process for producing a bonded body by bonding a ceramic member made of a ceramic to a Cu member made of Cu or a Cu alloy, the process including: a laminating step of laminating the Cu member on a first surface side of the ceramic member via a brazing material containing Cu and a eutectic element which has a eutectic reaction with Cu, and via an active metal; and a heating step of heating the ceramic member and the Cu member which are laminated together.

12 Claims, 4 Drawing Sheets

(51) Int. Cl.
*B23K 1/19* (2006.01)
*B23K 1/20* (2006.01)
*C22C 9/00* (2006.01)
*C22C 9/01* (2006.01)
*H01L 23/40* (2006.01)
*B23K 35/30* (2006.01)
*C22C 9/02* (2006.01)
*B23K 35/26* (2006.01)
*B23K 35/28* (2006.01)
*C22C 12/00* (2006.01)
*C22C 13/00* (2006.01)
*C22C 21/00* (2006.01)
*C22C 24/00* (2006.01)
*C22C 28/00* (2006.01)

(52) U.S. Cl.
CPC ............ *B23K 35/302* (2013.01); *C04B 37/02* (2013.01); *C22C 9/00* (2013.01); *C22C 9/01* (2013.01); *C22C 9/02* (2013.01); *H01L 23/40* (2013.01); *B23K 35/26* (2013.01); *B23K 35/28* (2013.01); *B23K 35/30* (2013.01); *C04B 2237/124* (2013.01); *C04B 2237/343* (2013.01); *C04B 2237/366* (2013.01); *C04B 2237/368* (2013.01); *C04B 2237/407* (2013.01); *C22C 12/00* (2013.01); *C22C 13/00* (2013.01); *C22C 21/00* (2013.01); *C22C 24/00* (2013.01); *C22C 28/00* (2013.01); *H01L 2924/0002* (2013.01)

(56) References Cited

FOREIGN PATENT DOCUMENTS

| | | |
|---|---|---|
| CN | 105190869 A | 12/2015 |
| EP | 0726238 A2 | 8/1996 |
| JP | 60-081071 A | 5/1985 |
| JP | 06-024854 A | 2/1994 |
| JP | 11-130555 A | 5/1999 |
| JP | 2003-188310 A | 7/2003 |
| JP | 2003-197826 A | 7/2003 |
| JP | 2003-285195 A | 10/2003 |
| JP | 4375730 B2 | 12/2009 |
| WO | 2013/024813 A1 | 2/2013 |

OTHER PUBLICATIONS

Supplemental Search Report dated Aug. 28, 2017, issued for the European patent application No. 15783486.2.
International Search Report dated Jun. 9, 2015, issued for PCT/JP2015/061719 and English translation thereof.
Office Action dated Nov. 30, 2018 issued for corresponding Chinese Patent Application No. 201580013381.X.

* cited by examiner

PROCESS FOR PRODUCING BONDED BODY AND PROCESS FOR PRODUCING POWER MODULE SUBSTRATE

TECHNICAL FIELD

The present invention relates to a process for producing a bonded body by rigidly bonding a ceramic member and a Cu member together, and a process for producing a power module substrate using the process for producing a bonded body.

Priority is claimed on Japanese Patent Application No. 2014-091955, tiled Apr. 25, 2014, the content of which is incorporated herein by reference.

BACKGROUND ART

A semiconductor device such as an LED or a power module has a structure in which a semiconductor element is bonded onto a circuit layer formed of a conductive material. A power semiconductor element for controlling a high amount of power used to control a wind power generation system or an electric vehicle such as an electric automobile generates a large amount of heat. For this reason, a ceramic substrate having good heat resistance and good insulating properties, which is made of silicon nitride ($Si_3N_4$), aluminum nitride (AlN), alumina ($Al_2O_3$), or the like, is used as a substrate on which such a power semiconductor element is mounted. In the related art, a power module substrate, in which a high-conductivity metal plate which is a circuit layer is bonded to a first surface of the ceramic substrate, is widely used. Another metal plate may be bonded to a second surface of the ceramic substrate.

For example, a power module substrate disclosed in Patent Document 1 has a structure in which a circuit layer is formed by bonding a Cu plate (Cu member) to a first surface of a ceramic substrate (ceramic member). In the power module substrate, the Cu plate is bonded to the first surface of the ceramic substrate by heating the Cu plate and the ceramic substrate in a state where the Cu plate is disposed on the first surface of the ceramic substrate with a Cu—Mg—Ti brazing material interposed between the ceramic substrate and the Cu plate.

CITATION LIST

Patent Literature

[Patent Document 1] Japanese Patent Publication No. 4375730

DISCLOSURE OF INVENTION

Technical Problem

As disclosed in Patent Document 1, if the circuit layer is formed by bonding the ceramic substrate and the Cu plate together via the Cu—Mg—Ti brazing material, a thick intermetallic compound layer containing Cu, Mg, or Ti is formed at a bonded interface between the ceramic substrate and the brazing material.

Since the intermetallic compound layer formed at the bonded interface between the ceramic substrate and the brazing material is hard, in a case where the substrate for a power module is subjected to hot-cold cycles, the reliability of bonding the ceramic substrate and the circuit layer together decreases, which is a problem.

The present invention is made in light of this problem, and an object of the present invention is to provide a process for producing a bonded body having high reliability of bonding by which it is possible to satisfactorily bond a ceramic member and a Cu member together, and a process for producing a substrate for a power module using the process for producing a bonded body.

Solution to Problem

In order to solve this problem, according to a first aspect of the present invention, a process for producing a bonded body by bonding a ceramic member made of a ceramic and a Cu member made of Cu or a Cu alloy together includes: a laminating step of laminating the Cu member on a first surface side of the ceramic member via a brazing material containing Cu and a eutectic element which has a eutectic reaction with Cu, and via an active metal; and a heating step of heating the ceramic member and the Cu member which are laminated together.

According to the process for producing a bonded body, it is possible to bond the ceramic member and the Cu member together at a low bonding temperature and with high bonding strength, and to obtain a bonded body having high reliability of bonding by bonding the ceramic member and the Cu member together via the brazing material containing Cu and a eutectic element which has a eutectic reaction with Cu, and via the active metal.

In the laminating step, the brazing material is disposed on the ceramic member side, and the active metal is disposed on the Cu member side.

In this configuration, since the brazing material melted in the heating step reliably contacts with the ceramic member, it is possible to satisfactorily bond the ceramic member and the Cu member together.

The eutectic element is one element or two or more elements selected from Ca, Ge, Sr, Sn, Sb, Ba, La, Ce, and Al.

Since the adopted eutectic element has a eutectic reaction with Cu, it is possible to considerably decrease the melting temperature of the brazing material. Accordingly, it is possible to bond the ceramic member and the Cu member together at a low temperature.

In the laminating step, an Al member made of Al or an Al alloy is further laminated on a second surface side of the ceramic member, and in the heating step, the ceramic member, the Cu member, and the Al member which are laminated together are heated.

If a brazing material consisting of Cu and an element which has a eutectic reaction with Cu is used, it is possible to melt the brazing material at a temperature lower than the melting point of Al, and it is possible to perform a step of bonding the Cu member to the first surface side of the ceramic member and a step of laminating the Al member to the second surface side in a single step.

The ceramic member is made of any one of $Si_3N_4$, AlN, or $Al_2O_3$.

It is possible to produce a bonded body having good insulating properties and good heat dissipating properties by selecting $Si_3N_4$, AlN, or $Al_2O_3$ as the material of the ceramic member.

According to a second aspect of the present invention, there is provided a process for producing a power module substrate in which a Cu plate made of Cu or a Cu alloy is disposed on first surface of a ceramic substrate, in which the ceramic substrate and the Cu plate are bonded together using the process for producing a bonded body according to each of the foregoing descriptions.

According to the process for producing a power module substrate in the second aspect of the present invention, it is possible to bond the ceramic substrate and the Cu plate together at a low bonding temperature and with high bonding strength, and to obtain a power module substrate having high reliability of bonding by bonding the ceramic substrate and the Cu plate together with a brazing material, which contains Cu and a eutectic element having a eutectic reaction with Cu, and an active metal interposed between the ceramic substrate and the Cu plate.

The Cu plate bonded to the ceramic substrate serves as a circuit layer, or a metal layer that is formed on a surface of the ceramic substrate opposite to the surface to which the circuit layer is bonded.

Advantageous Effects of Invention

According to the process for producing a bonded body and the process for producing a power module substrate in the present invention, it is possible to satisfactorily bond a ceramic member and a Cu member together.

BEST MODE FOR CARRYING OUT THE INVENTION

Figure 1:
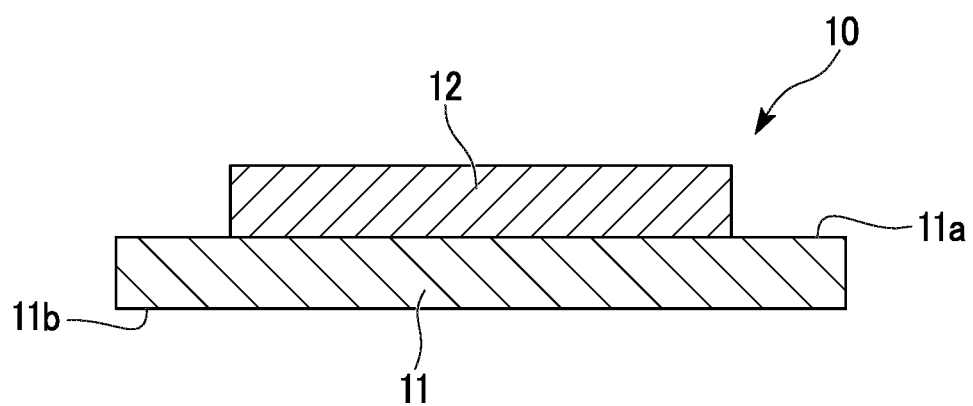
FIG. 1 shows a sectional view showing an example of a bonded body in an embodiment of the present invention.

Hereinafter, a process for producing a bonded body and a process for producing a power module substrate in the present invention will be described with reference to the accompanying drawings. An embodiment will be specifically described to help people better understand the concept of the invention; however, unless specified, the present invention is not limited to the embodiment. In the drawings referenced in the following description, for the sake of convenience, main portions may be shown in a magnified manner to help people easily understand the characteristics of the present invention, and the drawings are not limited to a case in which the dimensional ratio of each configuration element is the same as an actual one.

(Bonded Body)

FIG. 1 is a sectional view showing an example of a bonded body obtained using the process for a bonded body in the embodiment of the present invention.

As shown in FIG. 1, a bonded body 10 is formed of a ceramic member 11, and a Cu member 12 that is disposed on a first surface 11a (upper surface in FIG. 1) of the ceramic member 11 and is bonded to the ceramic member 11 via a brazing material.

The ceramic member 11 is made of a ceramic such as silicon nitride ($Si_3N_4$), aluminum nitride (AlN), or alumina ($Al_2O_3$) having good insulating properties and good heat dissipating properties. In the embodiment, the ceramic member 11 is made of aluminum nitride (AlN) having particularly good heat dissipating properties. The thickness of the ceramic member 11 is set to a value in a range of 0.2 mm to 1.5 mm, and in the embodiment, the thickness is set to 0.635 mm.

The Cu member 12 is made of Cu or a Cu alloy. In the embodiment, the Cu member is made of oxygen-free copper. The thickness of the Cu member is set to a value in a range of 0.1 mm to 1.0 mm, and in the embodiment, the thickness is set to 0.6 mm.

The Cu member 12 is bonded to the first surface 11a of the ceramic member 11 via a brazing material and an active metal.

The brazing material consists of Cu and a eutectic element that has a eutectic reaction with Cu. The eutectic element used in the brazing material is selected from constituent elements of an alloy having a melting point lower than that of Al due to a eutectic reaction with Cu. Examples of elements having a eutectic reaction with Cu include Ca, Ge, Sr, Sn, Sb, Ba, La, Ce, and Al (hereinafter, these elements are referred to as eutectic elements). The brazing material contains one element or two or more elements selected from these eutectic elements.

The amount of each eutectic element contained in the brazing material may be set to a value in the following corresponding range (mass %).

Ca: 32% to 78% (more desirably, 34% to 75%)
Ge: 37% to 41% (more desirably, 38% to 40%)
Sr: 58% to 93% (more desirably, 62% to 90%)
Sn: 56% to 90% (more desirably, 74% to 84%)
Sb: 52% to 97% (more desirably, 57% to 92%)
Ba: 62% to 95% (more desirably, 68% to 91%)
La: 72% to 89% (more desirably, 74% to 87%)
Ce: 73% 93% (more desirably, 75% to 90%)
Al: 40% to 95% (more desirably, 50% to 85%)

In the embodiment, a brazing material having a composition of 25 mass % Cu and 75 mass % Ba is used.

Since such a brazing material contains Cu and a eutectic element that has a eutectic reaction with Cu, the brazing material may melt at a temperature lower than the melting point of Al. It is possible to rigidly bond the Cu member 12 made of Cu or a Cu alloy and the ceramic member 11 together at a low bonding temperature.

That is, it is possible to bond the Cu member 12 and the ceramic member 11 together at a bonding temperature lower than the melting point of Al.

The active metal contains one element or two or more active elements such as Ti, Zr, Nb, and Hf. In the embodiment, Ti is used as an active metal material.

The ceramic member 11 is preferably configured such that an Al member made of Al or an Al alloy is bonded to a second surface 11b side of the ceramic member 11. An Al member made of 4N—Al is an example of such an Al member. An Al—Si-based brazing material or the like may be used to bond the ceramic member 11 and the Al member together. In this case, the concentration of Si contained in the Al—Si-based brazing material is preferably set to a value in a range of 1 mass % to 12 mass %; however, the concentration of Si is not limited to this range.

(Process for Producing Bonded Body)

Figure 2:
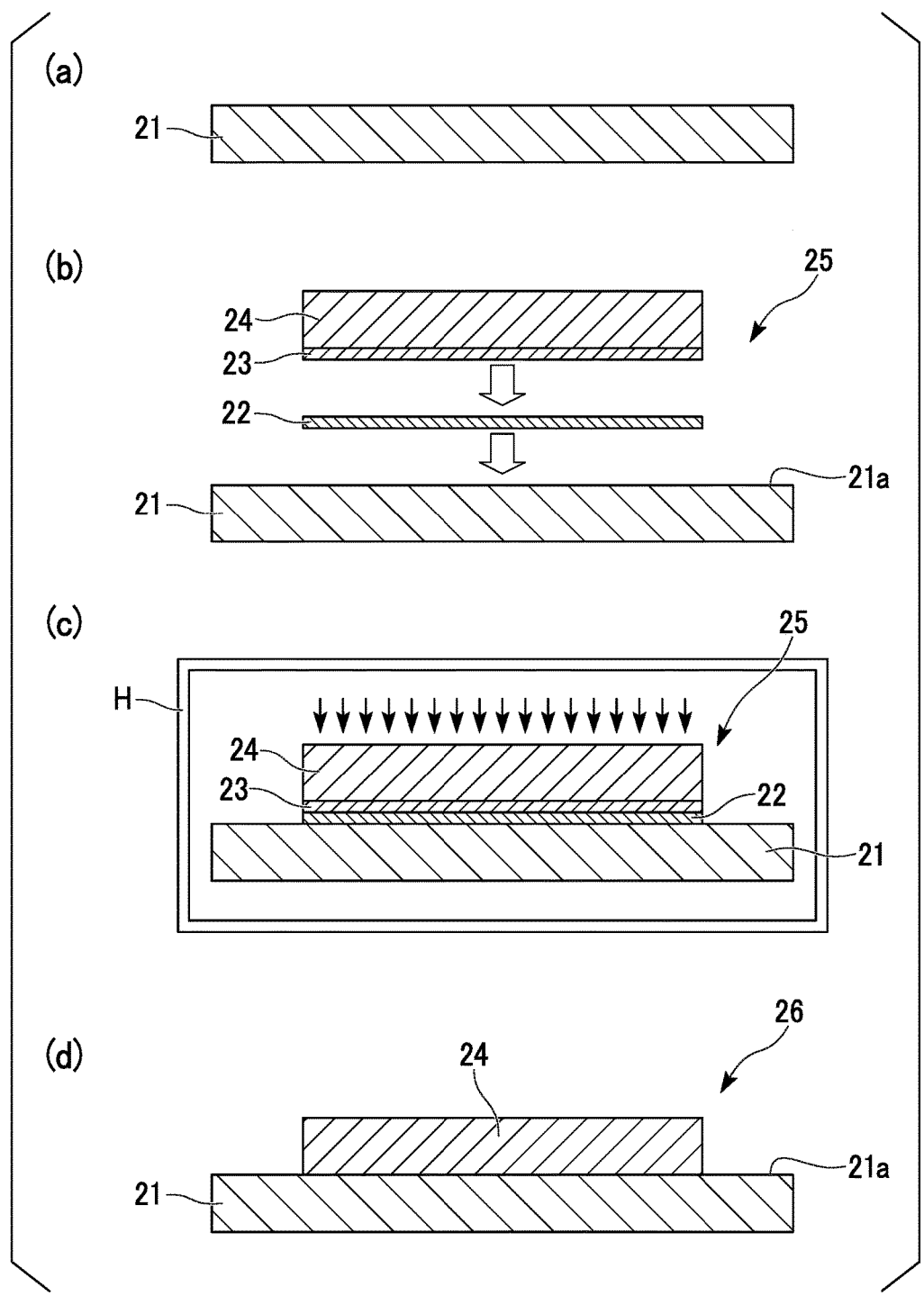
FIG. 2 shows sectional views showing a process of producing a bonded body in the embodiment of the present invention step by step.

FIG. 2 shows sectional views showing the process for producing a bonded body in the embodiment of the present invention step by step.

First, a ceramic member 21 made of a ceramic such as silicon nitride ($Si_3N_4$), aluminum nitride (AlN), or alumina ($Al_2O_3$) is prepared (refer to FIG. 2(a)) so as to produce a bonded body used as a power module substrate. In the embodiment, a ceramic substrate made of AlN and having a thickness of 0.635 mm is prepared.

Subsequently, a laminated body 25 is formed by laminating a brazing material 22, an active metal 23, and a Cu member 24 on a first surface 21a side of the ceramic member 21 in the listed sequence (refer to FIG. 2(b): laminating step). The brazing material 22 consists of Cu and one element or two or more elements selected from eutectic elements such as Ca, Ge, Sr, Sn, Sb, Ba, La, Ce, and Al which have a eutectic reaction with Cu.

The brazing material 22 is formed by coating a first surface 21a of the ceramic member 21 with a paste-like brazing material (brazing paste) that is formed by mixing Cu powders and eutectic element powders together and binding the powders together via a suitable binder.

It is also possible to coat the first surface 21a of the ceramic member 21 with a paste-like brazing material (brazing paste) that is formed by binding alloy powders of Cu and a eutectic element together via a suitable binder.

It is also possible to dispose a foil-like brazing material consisting of Cu and a eutectic element between the ceramic member 21 and the active metal 23.

In the embodiment, the first surface 21a of the ceramic member 21 is coated with a paste-like brazing material as the brazing material 22 which is formed by mixing 60 parts by mass alloy powders (mass ratio of Cu to Ba is 25: 75) with 4 parts by mass acrylic resin and 36 parts by mass texanol that is a solvent. The coating thickness of the brazing material 22 is set to approximately 5 µn to approximately 80 µm.

The active metal 23 contains one element or two or more elements of active elements such as Ti, Zr, Nb, and Hf. It is possible to provide the active metal 23 in the form of a foil, powders, or a paste that is obtained by adding a suitable binder into powders and kneading a mixture of the powders and the binder. In a case where the active metal 23 in the form of a paste is used, it is also possible to use the hydride of an active element (for example, $TiH_2$ or $ZrH_2$). It is also possible to provide the active metal 23 on the Cu member 24 or the ceramic member 21 via vapor deposition. The thickness of the active metal 23 is set to 0.05 µm or greater and 25 µm or less.

In a case where the thickness of the active metal 23 is required to be thin, the active metal 23 is preferably formed via vapor deposition. In a case where the thickness of the active metal 23 is required to be relatively thick, the active metal 23 in the form of foil or a paste is preferably used.

In the embodiment, the active metal 23 is formed by vapor depositing Ti on the Cu member 24.

In the embodiment, as shown in FIG. 2, the active metal 23 is disposed on the Cu member 24 side. Alternatively, the active metal 23 may be disposed on the ceramic member 21 side. In this case, the ceramic member 21, the active metal 23, the brazing material 22, and the Cu member 24 are laminated in the laminated body 25 in the listed laminating sequence.

Subsequently, as shown in FIG. 2(c), the laminated body 25 is put into a vacuum heating furnace H, and is heated up to the melting temperature (bonding temperature) of the brazing material 22 or higher while pressurizing the laminated body 25 (heating step). Accordingly, the brazing material 22 melts. Thereafter, if the laminated body 25 cools, as shown in FIG. 2(d), a bonded body 26 in which the ceramic member 21 and the Cu member 24 are bonded together is obtained.

The brazing material 22 in the embodiment of the present invention will be further described. Since the brazing material 22 contains one element or two or more elements selected from eutectic elements such as Ca, Ge, Sr, Sn, Sb, Ba, La, Ce, and Al which have a eutectic reaction with Cu, the melting point of the brazing material can be reliably decreased by a eutectic reaction of the elements with Cu.

As an example, it is possible to decrease the melting point to 530° C. by adding Ba as a eutectic element in a range of 68 mass % to 92 mass % to Cu, in contrast to a case where the brazing material 22 contains only Cu.

It is possible to prevent an increase in the melting point of the brazing material 22, to prevent a decrease in the fluidity of the brazing material 22, and to further improve bondability between the ceramic member 21 and the Cu member 24 by selecting two or more from eutectic elements.

In the heating step of the embodiment, the heating temperature is set to a value in a range of 600° C. to 650° C. In a case where the heating temperature is 600° C. or greater, it is possible to reliably melt the brazing material 22 at the bonding interface between the ceramic member 21 and the Cu member 24, and to reliably bond the ceramic member 21 and the Cu member 24 together.

In a case where the heating temperature is 650° C. or less, it is possible to prevent thermal degradation of the ceramic member 21, and to decrease thermal stress occurring in the ceramic member 21.

In a case where pressure applied to the laminated body 25 is 1 kgf/cm$^2$ (0.10 MPa) or greater in the heating step, it is possible to make the ceramic member 21 come into close contact with a liquid phase of the brazing material 22, and to rigidly bond the ceramic member 21 and the Cu member 24 together. In a case where the applied pressure is 35 kgf/cm$^2$ (3.43 MPa) or less, it is possible to prevent the occurrence of stress-induced cracking in the ceramic member 21. For this reason, in the embodiment, the pressure applied to the laminated body 25 is set to a value in a range of 1 kgf/cm$^2$ to 35 kgf/cm$^2$ (0.10 MPa to 3.43 MPa).

In a case where a heating time is 30 minutes or greater in the heating step, the melted brazing material 22 at the bonding interface between the ceramic member 21 and the Cu member 24 penetrates into a surface layer of the ceramic member 21 or a surface layer of the Cu member 24. Therefore, it is possible to reliably bond the ceramic member 21 and the Cu member 24 together. If the heating time exceeds 360 minutes, productivity may decreases. For this reason, in the embodiment, the heating time is set to a value in a range of 30 minutes to 360 minutes.

(Process for Producing Power Module Substrate)

Figure 3:
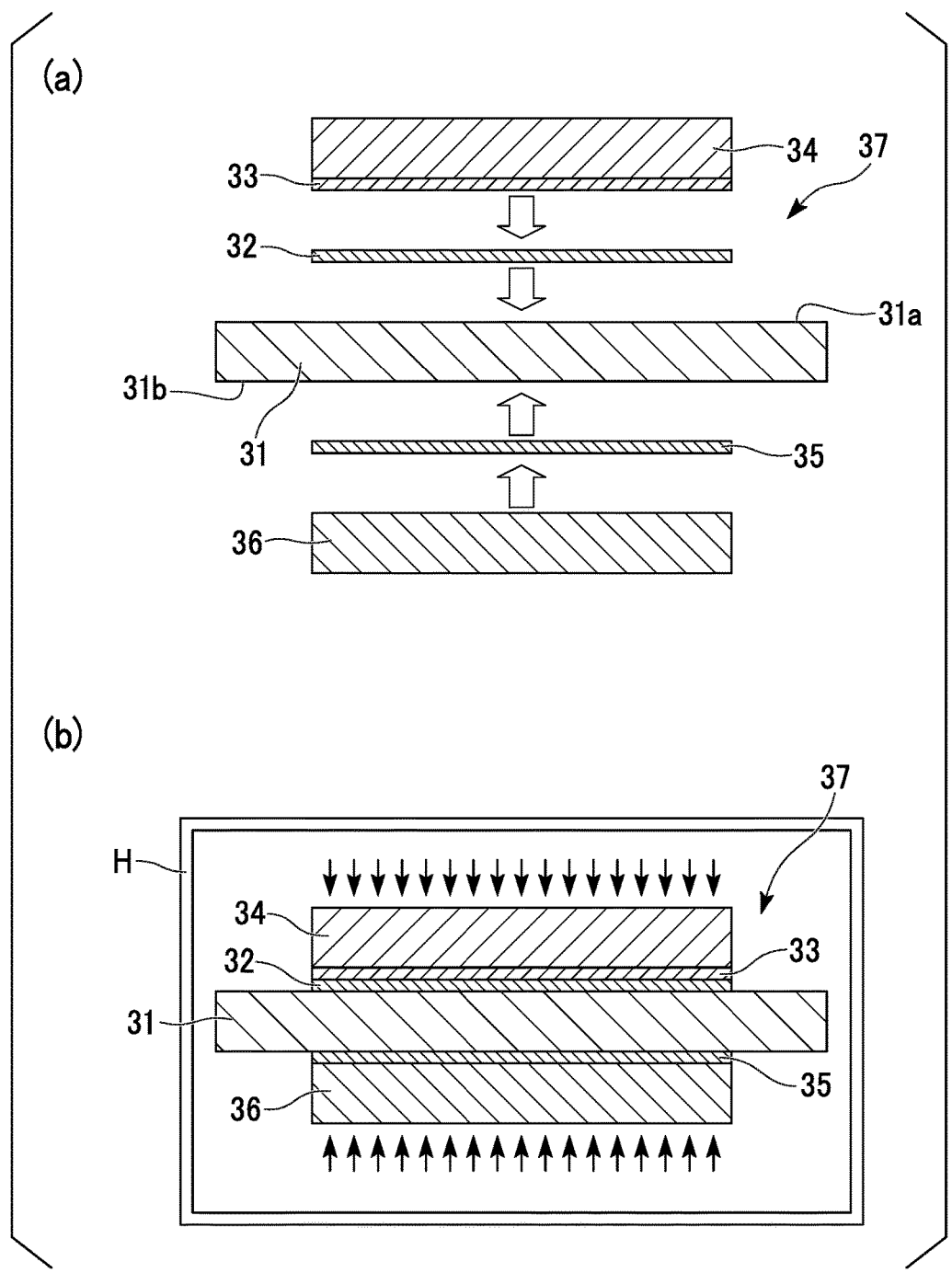
FIG. 3 shows sectional views showing a process of producing a power module substrate in the embodiment of the present invention step by step.
Figure 4:
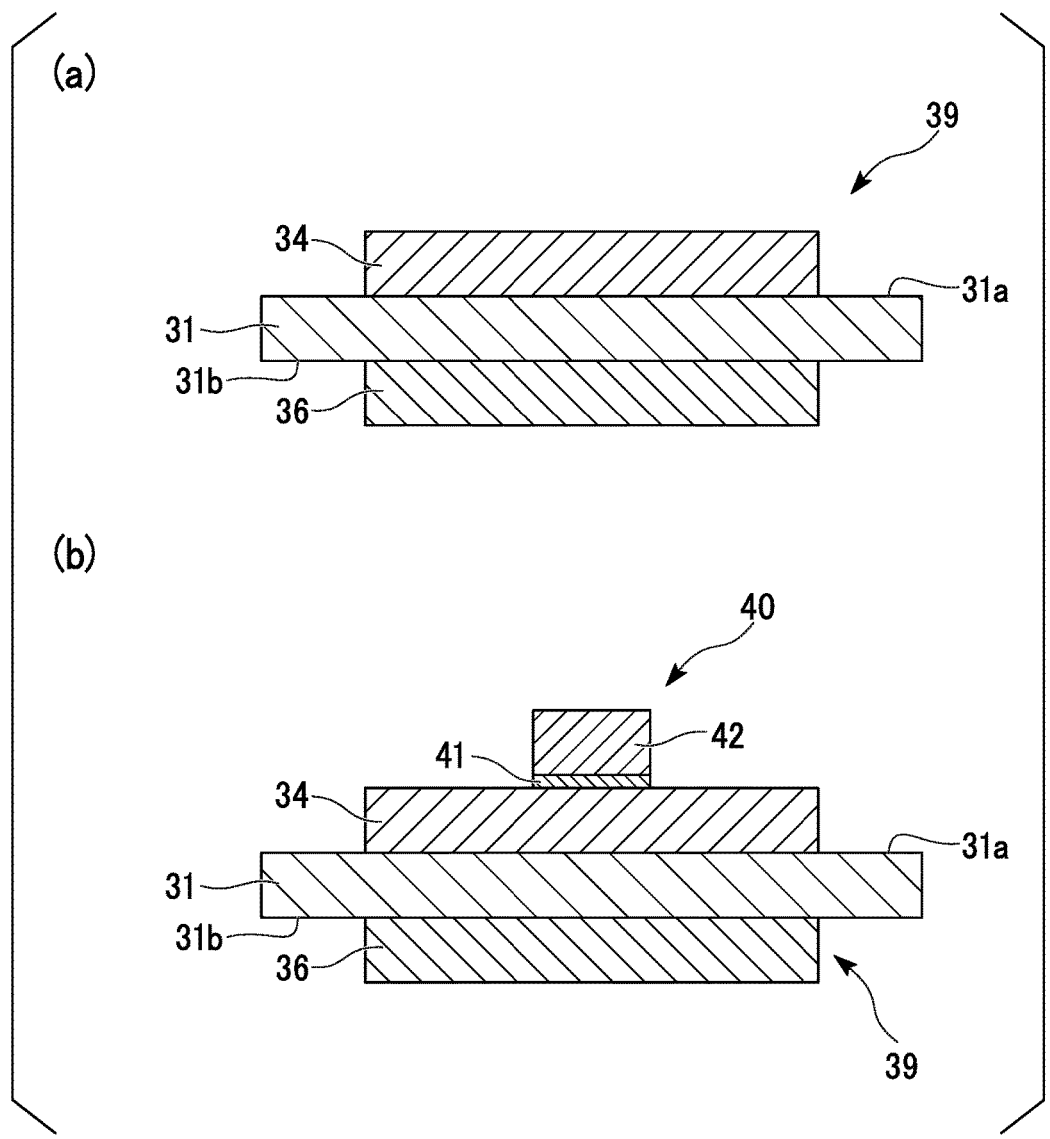
FIG. 4 shows sectional views showing the process of producing a power module substrate in the embodiment of the present invention step by step.

FIGS. 3 and 4 are sectional views showing the process for producing a power module substrate in the embodiment of the present invention step by step.

As shown in FIG. 3(a), first, a ceramic substrate 31 made of a ceramic is prepared to produce a power module substrate. A brazing material 32, an active metal 33, and a Cu plate 34 are laminated on a first surface 31a side of the ceramic substrate 31 in the listed sequence. A laminated body 37 is formed by laminating a brazing material 35 and an Al plate 36 on a second surface 31b side of the ceramic substrate 31 (laminating step).

Examples of constituent ceramics of the ceramic substrate 31 include silicon nitride ($Si_3N_4$), aluminum nitride (AlN), or alumina ($Al_2O_3$). In the embodiment, a ceramic substrate made of AlN which has a thickness of 0.635 mm is prepared.

The brazing material 32 consists of Cu and one element or two or more elements selected from eutectic elements such as Ca, Ge, Sr, Sn, Sb, Ba, La, Ce, and Al which have a eutectic reaction with Cu.

In the embodiment, the same brazing material as the brazing material 22 is used as the brazing material 32.

The active metal 33 contains one element or two or more elements of active elements such as Ti, Zr, Nb, and Hf. It is possible to provide the active metal 33 in the form of a foil, powders, or a paste that is obtained by adding a suitable binder into powders and kneading a mixture of the powders and the binder. In a case where the active metal 33 in the form of a paste is used, it is also possible to use the hydride of an active element (for example, $TiH_2$ or $ZrH_2$). It is also possible to provide the active metal 33 on the Cu plate 34 or the ceramic substrate 31 via vapor deposition. The thickness of the active metal 33 is set to 0.05 μm to 25 μm.

In a case where the thickness of the active metal 33 is required to be thin, the active metal 33 is preferably formed via vapor deposition. In a case where the thickness of the active metal 33 is required to be relatively thick, the active metal 33 in the form of foil or a paste is preferably used.

In the embodiment, the active metal 33 is formed by vapor depositing Ti as an active metal on the Cu plate 34.

In the embodiment, as shown in FIG. 3, the active metal 33 is disposed on the Cu plate 34 side. Alternatively, the active metal 33 may be disposed on the ceramic substrate 31 side. In this case, the ceramic substrate 31, the active metal 33, the brazing material 32, and the Cu plate 34 are laminated in the laminated body 37 in the listed laminating sequence.

The active metal 33 may be disposed between the ceramic substrate 31 and the Cu plate 34 in a state where a portion or the entirety of the active metal 33 is mixed with the brazing material 32.

The Al plate 36 is made of Al or an Al alloy. In the embodiment, an Al plate made of 4N—Al is used. For example, an Al—Si-based brazing material may be used as the brazing material 35, which is capable of bonding a ceramic and Al together and melts at an equal melting temperature of the brazing material 32 or at a lower temperature than melting temperature of the brazing material 32. In this case, the concentration of Si contained in the Al—Si-based brazing material is preferably set to a value in a range between 1 mass % and 12 mass %.

Subsequently, as shown in FIG. 3(b), the laminated body 37 is put into the vacuum heating furnace H, and is heated up to the respective melting temperatures (bonding temperatures) of the brazing materials 32 and 35 or higher (heating step) while applying the predetermined pressure to the laminated body 37. Accordingly, the brazing materials 32 and 35 melt. Thereafter, if the laminated body 37 cools, as shown in FIG. 4(d), a power module substrate 39 in which the Cu plate 34 is bonded to the first surface 31a side of the ceramic substrate 31 and the Al plate 36 is bonded to the second surface 31b side of the ceramic substrate 31.

It is possible to melt the brazing material 32 at a temperature considerably lower than the melting point of Al by using the brazing material 32 consisting of Cu and a eutectic element that has a eutectic reaction with Cu, and it is possible to bond the ceramic substrate 31 and the Cu plate 34 together. Accordingly, even if the Al plate 36 having a relatively low melting point is bonded to the second surface 31b side of the ceramic substrate 31, it is possible to concurrently bond the Cu plate 34 and the Al plate 36 to the ceramic substrate 31 in one heating step.

As shown in FIG. 4(b), it is possible to produce a power module 40 by bonding a semiconductor element 42 to the Cu plate 34 of the substrate 39 for a power module via a soldering layer 41. In this case, the Cu plate 34 serves as a circuit layer that forms a wiring pattern of the power module 40. The Al plate 36 serves as a metallic layer of the power module 40, for example, a heat dissipating plate.

In the power module 40, the Cu plate 34 is a circuit layer; however, the Cu plate 34 is not necessarily a circuit layer. For example, the Cu plate may be bonded to a surface of the ceramic substrate opposite to the circuit player, and serve as a metal layer.

The power module 40 may be used as a power module with a heat sink by disposing a heat sink on the Al plate 36 of the power module 40 (lower side in FIG. 4).

The heat sink is used to cool the power module 40, and includes a top plate portion bonded to the power module 40, and a flow path for allowing a flow of a cooling medium (for example, coolant). The heat sink is desirably made of a material having good thermal conductivity, and may be made of pure copper such as oxygen-free copper, a copper alloy, pure aluminum, an aluminum alloy such as A6063 (aluminum alloy), or the like. The heat sink (top plate portion) is bonded to the Al plate 36 of the power module 40 via soldering, brazing or the like.

EXAMPLES

Hereinafter, results of confirmation tests (examples) performed to confirm effects of the embodiment of the present invention will be described.

Example 1

A brazing material, an active metal (foil having a thickness of 6 μm), and a Cu plate (37 mm×37 mm×thickness 0.3 mm) made of oxygen-free copper shown in Table 1 were laminated on a first surface of a ceramic substrate (40 mm×40 mm×thickness 0.635 mm) made of AlN in the listed sequence.

In Comparative Example 1, an element (Ni) which does not have a eutectic reaction with Cu was used as a brazing material. According to the configuration in Comparative Example 2, Cu foil was interposed between a ceramic substrate and a Cu plate.

In each of the examples and the comparative examples, the Cu plate was bonded to the first surface of the ceramic substrate by putting a laminated body into a vacuum heating furnace in a state where a pressure of 15 kgf/cm² (1.47 MPa) was applied to the laminated body in a laminating direction, and by heating the laminated body. The internal pressure of the vacuum heating furnace was set to $10^{-3}$ Pa, and a heating temperature and a heat time were set to conditions shown in Table 1. In this manner, bonded bodies in Examples 1-1 to 1-42 and Comparative Examples 1 and 2 were obtained.

Each of the bonded bodies in Examples 1-1 to 1-42 and Comparative Examples 1 and 2 obtained in the aforementioned manner was evaluated for an initial bonding rate between the Cu plate and the ceramic substrate.

The evaluation of a bonding rate for each bonded body was performed in such a way that the bonding rate of the interface between the ceramic substrate and the Cu plate was evaluated using an ultrasonic flaw detector (FineSAT200 made by Hitachi Power Solutions), and was calculated using the following expression.

An initial bonding area was set as an area to be bonded before bonding, that is, an area (37 cm×37 mm) of the Cu member in this example. Since delamination in a bonded portion is shown by a white colored portion in an image obtained by binarizing an ultrasonic flaw detection image, the area of the white colored portion was considered as a delamination area.

(Bonding Rate (%))={(Initial Bonding Area)−(Delamination Area)}/(Initial Bonding Area)×100

Table 1 shows the results of the aforementioned confirmation tests.

TABLE 1

| | | Brazing Material (mass %) | | | | | | | | | | Cu and Inevitable Impurities | Active Metal | Ceramic Substrate | Thickness of Brazing Material (μm) | Heating Conditions Temperature (° C.) | Heating Conditions Time (minutes) | Initial bonding Rate (%) |
|---|---|---|---|---|---|---|---|---|---|---|---|---|---|---|---|---|---|---|
| | | Ca | Ge | Sr | Sn | Sb | Ba | La | Ce | Al | Ni | | | | | | | |
| Examples | 1-1 | 32 | | | | | | | | | | Remain | Ti | AlN | 40 | 650 | 120 | 88.9 |
| | 1-2 | 34 | | | | | | | | | | Remain | Ti | AlN | 40 | 650 | 120 | 98.0 |
| | 1-3 | 75 | | | | | | | | | | Remain | Ti | AlN | 40 | 650 | 120 | 97.8 |
| | 1-4 | 78 | | | | | | | | | | Remain | Ti | AlN | 40 | 650 | 120 | 90.6 |
| | 1-5 | | 37 | | | | | | | | | Remain | Ti | AlN | 40 | 650 | 360 | 86.2 |
| | 1-6 | | 38 | | | | | | | | | Remain | Ti | AlN | 40 | 650 | 360 | 93.1 |
| | 1-7 | | 40 | | | | | | | | | Remain | Ti | AlN | 40 | 650 | 360 | 92.9 |
| | 1-8 | | 41 | | | | | | | | | Remain | Ti | AlN | 40 | 650 | 360 | 88.8 |
| | 1-9 | | | 58 | | | | | | | | Remain | Ti | AlN | 40 | 650 | 90 | 90.5 |
| | 1-10 | | | 62 | | | | | | | | Remain | Ti | AlN | 40 | 650 | 90 | 98.9 |
| | 1-11 | | | 90 | | | | | | | | Remain | Ti | AlN | 40 | 650 | 90 | 99.3 |
| | 1-12 | | | 93 | | | | | | | | Remain | Ti | AlN | 40 | 650 | 90 | 86.7 |
| | 1-13 | | | | 56 | | | | | | | Remain | Ti | AlN | 80 | 650 | 90 | 87.9 |
| | 1-14 | | | | 74 | | | | | | | Remain | Ti | AlN | 80 | 650 | 90 | 98.1 |
| | 1-15 | | | | 84 | | | | | | | Remain | Ti | AlN | 80 | 650 | 90 | 96.8 |
| | 1-16 | | | | 90 | | | | | | | Remain | Ti | AlN | 80 | 650 | 90 | 90.3 |
| | 1-17 | | | | | 52 | | | | | | Remain | Ti | AlN | 40 | 650 | 30 | 90.5 |
| | 1-18 | | | | | 57 | | | | | | Remain | Ti | AlN | 40 | 650 | 30 | 98.2 |
| | 1-19 | | | | | 92 | | | | | | Remain | Ti | AlN | 40 | 650 | 30 | 98.6 |
| | 1-20 | | | | | 97 | | | | | | Remain | Ti | AlN | 40 | 650 | 30 | 86.2 |
| | 1-21 | | | | | | 62 | | | | | Remain | Ti | AlN | 50 | 630 | 180 | 88.8 |
| | 1-22 | | | | | | 68 | | | | | Remain | Ti | AlN | 50 | 630 | 180 | 99.1 |
| | 1-23 | | | | | | 91 | | | | | Remain | Ti | AlN | 50 | 630 | 180 | 99.4 |
| | 1-24 | | | | | | 95 | | | | | Remain | Ti | AlN | 50 | 630 | 180 | 87.3 |
| | 1-25 | | | | | | | 72 | | | | Remain | Ti | AlN | 50 | 610 | 150 | 84.6 |
| | 1-26 | | | | | | | 74 | | | | Remain | Ti | AlN | 50 | 610 | 150 | 98.7 |
| | 1-27 | | | | | | | 87 | | | | Remain | Ti | AlN | 50 | 610 | 150 | 97.5 |
| | 1-28 | | | | | | | 89 | | | | Remain | Ti | AlN | 50 | 610 | 150 | 80.4 |
| | 1-29 | | | | | | | | 73 | | | Remain | Ti | AlN | 50 | 610 | 150 | 86.1 |
| | 1-30 | | | | | | | | 75 | | | Remain | Ti | AlN | 50 | 610 | 150 | 98.9 |
| | 1-31 | | | | | | | | 90 | | | Remain | Ti | AlN | 50 | 610 | 150 | 97.7 |
| | 1-32 | | | | | | | | 93 | | | Remain | Ti | AlN | 50 | 610 | 150 | 88.2 |
| | 1-33 | | | | | | | | | 40 | | Remain | Ti | AlN | 40 | 630 | 60 | 92.3 |
| | 1-34 | | | | | | | | | 50 | | Remain | Ti | AlN | 40 | 630 | 60 | 98.1 |
| | 1-35 | | | | | | | | | 85 | | Remain | Ti | AlN | 40 | 630 | 60 | 98.8 |
| | 1-36 | | | | | | | | | 95 | | Remain | Ti | AlN | 40 | 630 | 60 | 91.0 |
| | 1-37 | | | 15 | 35 | | | | | | | Remain | Ti | AlN | 50 | 650 | 90 | 95.8 |
| | 1-38 | | | 80 | | | | | | | | Remain | Zr | AlN | 30 | 610 | 90 | 98.7 |
| | 1-39 | | | 80 | | | | | | | | Remain | Nb | AlN | 70 | 630 | 120 | 98.6 |
| | 1-40 | | | 80 | | | | | | | | Remain | Hf | AlN | 70 | 630 | 120 | 99.4 |
| | 1-41 | | | 80 | | | | | | | | Remain | Ti | Si$_3$N$_4$ | 40 | 650 | 120 | 97.6 |
| | 1-42 | | | 80 | | | | | | | | Remain | Ti | Al$_2$O$_3$ | 40 | 650 | 120 | 97.5 |
| Comparative Examples | 1 | | | | | | | | | | 20 | Remain | Ti | AlN | 50 | 650 | 360 | 0.0 |
| | 2 | | | Not Added | | | | | | | | Remain | Ti | AlN | 50 | 650 | 120 | 0.0 |

In Examples 1-1 to 1-42, it was confirmed from the results shown in Table 1 that since the ceramic substrate and the Cu plate were bonded together with a brazing material, which contains Cu and a eutectic element having a eutectic reaction with Cu, interposed between the ceramic substrate and the Cu plate, an initial bonding rate between the ceramic substrate and the Cu plate was high and the ceramic substrate and the Cu plate were rigidly bonded together.

In contrast, in Comparative Example 1 in which Cu and an element which did not form a eutectic alloy with Cu were used to bond the ceramic substrate and the Cu plate together, and Comparative Example 2 in which an element which formed a eutectic alloy was not used to bond the ceramic substrate and the Cu plate together, the ceramic substrate and the Cu plate were not bonded together.

Example 2

A brazing material, an active metal (foil having a thickness of 1 μm), and a Cu plate (37 mm×37 mm×thickness 0.3 mm) made of oxygen-free copper shown in Table 2 were laminated on a first surface of a ceramic substrate (40 mm×40 mm×thickness 0.635 mm) shown in Table 2 in the listed sequence. A laminated body was produced by laminating an aluminum plate (37 mm×37 mm×thickness 0.6 mm) having a purity of 99.99% or higher on a second surface of the ceramic substrate via Al-10 mass % Si brazing foil (thickness of 20 μm).

The Cu plate and the aluminum plate were respectively bonded to the first surface and the second surface of the ceramic substrate by putting a laminated body into a vacuum heating furnace in a state where a pressure of 15 kgf/cm$^2$ (1.47 MPa) was applied to the laminated body in a laminating direction, and by heating the laminated body. The internal pressure of the vacuum heating furnace was set to 10$^{-3}$ Pa, and a heating temperature and a heat time were set to conditions shown in Table 2. In this manner, a power module substrate in each of Examples 2-1 to 2-15 was obtained.

Each obtained power module substrate was evaluated for an initial bonding rate and a bonding rate after the execution of a thermal cycling test between the Cu plate and the ceramic substrate. The thermal cycling test of 3000 cycles was executed on each power module substrate using a hot-cold shock tester (TSB-51 made by ESPEC). One cycle of the thermal cycling test involved an exposure of a power module substrate to a liquid (Fluorinert) at −40° C. for 5 minutes and at 125° C. for 5 minutes.

The bonding rates were calculated using the same method as that of Example 1.

Table 2 shows results.

TABLE 2

| | | Brazing Material (mass %) | | | | | | | | Cu and Inevitable Impurities | Active Metal | Ceramic Substrate | Thickness of Brazing Material (μm) | Heating Conditions | | Initial Bonding Rate (%) | Bonding Rate After Hot-Cold Cycles (%) |
|---|---|---|---|---|---|---|---|---|---|---|---|---|---|---|---|---|---|
| | | Ca | Ge | Sr | Sn | Sb | Ba | La | Ce | Al | | | | | Temperature (° C.) | Time (minutes) | | |
| Examples | 2-1 | 50 | | | | | | | | | Remain | Ti | AlN | 40 | 650 | 120 | 96.8 | 94.4 |
| | 2-2 | | 40 | | | | | | | | Remain | Ti | AlN | 40 | 650 | 360 | 98.0 | 92.6 |
| | 2-3 | | | 70 | | | | | | | Remain | Ti | AlN | 40 | 650 | 90 | 98.6 | 96.3 |
| | 2-4 | | | | 80 | | | | | | Remain | Ti | AlN | 80 | 650 | 90 | 98.1 | 93.0 |
| | 2-5 | | | | | 70 | | | | | Remain | Ti | AlN | 40 | 650 | 30 | 98.2 | 92.9 |
| | 2-6 | | | | | | 75 | | | | Remain | Ti | AlN | 50 | 650 | 150 | 97.5 | 93.6 |
| | 2-7 | | | | | | | 80 | | | Remain | Ti | AlN | 50 | 650 | 120 | 98.3 | 96.8 |
| | 2-8 | | | | | | | | 80 | | Remain | Ti | AlN | 50 | 650 | 120 | 98.8 | 93.1 |
| | 2-9 | | | | | | | | | 30 | Remain | Ti | AlN | 40 | 650 | 30 | 97.6 | 93.8 |
| | 2-10 | | 15 | | 35 | | | | | | Remain | Ti | AlN | 50 | 650 | 90 | 98.0 | 94.3 |
| | 2-11 | | | 70 | | | | | | | Remain | Zr | AlN | 30 | 650 | 60 | 97.1 | 94.8 |
| | 2-12 | | | 70 | | | | | | | Remain | Nb | AlN | 70 | 650 | 90 | 98.6 | 94.5 |
| | 2-13 | | | 70 | | | | | | | Remain | Hf | AlN | 70 | 650 | 90 | 97.1 | 93.4 |
| | 2-14 | | | 70 | | | | | | | Remain | Ti | $Si_3N_4$ | 40 | 650 | 120 | 97.6 | 92.7 |
| | 2-15 | | | 70 | | | | | | | Remain | Ti | $Al_2O_3$ | 40 | 650 | 120 | 98.0 | 96.0 |

In each of Examples 2-1 to 2-15 in which the ceramic substrate and the Cu plate were bonded together with the brazing material, which contains Cu and a eutectic element having a eutectic reaction with Cu, interposed between the ceramic substrate and the Cu plate, it was confirmed that it was possible to obtain a power module substrate which had a high initial bonding rate and was capable of maintaining the high bonding rate even after the power module substrate was subjected to hot-cold cycles.

INDUSTRIAL APPLICABILITY

According to a process for producing a bonded body and a process for producing a power module substrate in the present invention, it is possible to satisfactorily bond a ceramic member and a Cu member together. For this reason, according to the process for producing a bonded body and the process for producing a power module substrate in the present invention, it is possible to produce a bonded body and a power module substrate which are suitable for a power module exposed to severe usage environments, for example, a power semiconductor element for controlling a high amount of power which is used to control a wind power generation system or an electric vehicle such as an electric automobile.

REFERENCE SIGNS LIST

10: BONDED BODY
11: CERAMIC MEMBER
12: Cu MEMBER
21: CERAMIC MEMBER
22: BRAZING MATERIAL
23: ACTIVE METAL
24: Cu MEMBER
26: BONDED BODY
39: POWER MODULE SUBSTRATE

The invention claimed is:

1. A process for producing a bonded body by bonding a ceramic member made of a ceramic and a Cu member made of Cu or a Cu alloy together, the process comprising:
   a laminating step of laminating the Cu member on a first surface side of the ceramic member via a brazing material consisting of Cu and a eutectic element which has a eutectic reaction with Cu, and via an active metal; and
   a heating step of heating the ceramic member and the Cu member which are laminated together,
   wherein the eutectic element is one element or two or more elements selected from Ca, Ge, Sr, Sn, Sb, Ba, La, Ce, and Al.

2. The process for producing a bonded body according to claim 1,
   wherein in the laminating step, the brazing material is disposed on the ceramic member, and the active metal is disposed on the Cu member.

3. The process for producing a bonded body according to claim 1,
   wherein in the laminating step, an Al member made of Al or an Al alloy is further laminated on a second surface side of the ceramic member, and
   wherein in the heating step, the ceramic member, the Cu member, and the Al member which are laminated together are heated.

4. The process for producing a bonded body according to claim 1,
   wherein the ceramic member is made of any one of $Si_3N_4$, AlN, or $Al_2O_3$.

5. A process for producing a power module substrate in which a Cu plate made of Cu or a Cu alloy is disposed on a first surface of a ceramic substrate,
   wherein the ceramic substrate and the Cu plate are bonded together using the process for producing a bonded body according to claim 1.

6. The process for producing a bonded body according to claim 2, wherein in the laminating step, an Al member made of Al or an Al alloy is further laminated on a second surface side of the ceramic member, and wherein in the heating step, the ceramic member, the Cu member, and the Al member which are laminated together are heated.

7. The process for producing a bonded body according to claim 2, wherein the ceramic member is made of any one of $Si_3N_4$, AlN, or $Al_2O_3$.

8. The process for producing a bonded body according to claim 3, wherein the ceramic member is made of any one of $Si_3N_4$, AlN, or $Al_2O_3$.

9. The process for producing a bonded body according to claim 6, wherein the ceramic member is made of any one of $Si_3N_4$, AlN, or $Al_2O_3$.

10. A process for producing a power module substrate in which a Cu plate made of Cu or a Cu alloy is disposed on a first surface of a ceramic substrate, wherein the ceramic substrate and the Cu plate are bonded together using the process for producing a bonded body according to claim 2.

11. A process for producing a power module substrate in which a Cu plate made of Cu or a Cu alloy is disposed on a first surface of a ceramic substrate, wherein the ceramic substrate and the Cu plate are bonded together using the process for producing a bonded body according to claim 3.

12. A process for producing a power module substrate in which a Cu plate made of Cu or a Cu alloy is disposed on a first surface of a ceramic substrate, wherein the ceramic substrate and the Cu plate are bonded together using the process for producing a bonded body according to claim 4.

* * * * *